US012799289B2

(12) United States Patent
Umehara et al.

(10) Patent No.: US 12,799,289 B2
(45) Date of Patent: Nov. 17, 2026

(54) RESIN COMPOSITION, PREPREG OBTAINED USING SAME, RESIN-COATED FILM, RESIN-COATED METAL FOIL, METAL-CLAD LAMINATE, AND WIRING BOARD

(71) Applicant: PANASONIC INTELLECTUAL PROPERTY MANAGEMENT CO., LTD., Osaka (JP)

(72) Inventors: Hiroaki Umehara, Fukushima (JP); Masaaki Matsumoto, Fukushima (JP); Ryuji Takahashi, Fukushima (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 205 days.

(21) Appl. No.: 17/762,544

(22) PCT Filed: Sep. 14, 2020

(86) PCT No.: PCT/JP2020/034678
§ 371 (c)(1),
(2) Date: Mar. 22, 2022

(87) PCT Pub. No.: WO2021/060046
PCT Pub. Date: Apr. 1, 2021

(65) Prior Publication Data

US 2022/0356349 A1 Nov. 10, 2022

(30) Foreign Application Priority Data

Sep. 27, 2019 (JP) ................................. 2019-177944

(51) Int. Cl.
*C08J 5/24* (2006.01)
*B32B 15/08* (2006.01)
(Continued)

(52) U.S. Cl.
CPC ............... *C08J 5/244* (2021.05); *B32B 15/08* (2013.01); *B32B 15/14* (2013.01); *C08J 5/249* (2021.05);
(Continued)

(58) Field of Classification Search
CPC ........ C08J 5/244; C08J 5/249; C08J 2309/06; C08J 2371/10; C08J 2409/06;
(Continued)

(56) References Cited

U.S. PATENT DOCUMENTS

2007/0129502 A1 † 6/2007 Kawabe
2008/0300350 A1 12/2008 Ohno et al.
(Continued)

FOREIGN PATENT DOCUMENTS

CN 1914239 B 5/2010
CN 103965606 A 8/2014
(Continued)

OTHER PUBLICATIONS

ISR issued in INTERNATIONAL Patent Application No. PCT/JP2020/034678, Nov. 24, 2020, translation.
Documentary Evidence of Third-Party Submission.†

*Primary Examiner* — David T Karst
(74) *Attorney, Agent, or Firm* — GREENBLUM & BERNSTEIN, P.L.C.

(57) ABSTRACT

One aspect of the present application relates to a resin composition including a modified polyphenylene ether compound having a carbon-carbon unsaturated double bond at a molecular end, a maleimide compound having two or more N-substituted maleimide groups in one molecule, and a liquid styrene-butadiene copolymer having a weight average molecular weight of less than 10000 and having a 1,2-vinyl group.

13 Claims, 5 Drawing Sheets

(51) Int. Cl.

| | |
|---|---|
| ***B32B 15/14*** | (2006.01) |
| ***C08L 9/06*** | (2006.01) |
| ***C08L 71/12*** | (2006.01) |
| ***H05K 1/03*** | (2006.01) |

(52) U.S. Cl.

CPC ............... *C08L 9/06* (2013.01); *C08L 71/126* (2013.01); *H05K 1/0346* (2013.01); *H05K 1/0366* (2013.01); *B32B 2307/206* (2013.01); *B32B 2457/00* (2013.01); *C08J 2309/06* (2013.01); *C08J 2371/10* (2013.01); *C08J 2409/06* (2013.01); *C08J 2471/10* (2013.01); *C08L 2203/202* (2013.01)

(58) Field of Classification Search

CPC ...... C08J 2471/10; B32B 15/08; B32B 15/14; B32B 2307/206; B32B 2457/00; C08L 9/06; C08L 71/126; C08L 2203/202; H05K 1/0346; H05K 1/0366

USPC ....................................................... 525/333.3

See application file for complete search history.

(56) References Cited

U.S. PATENT DOCUMENTS

| | | | | |
|---|---|---|---|---|
| 2014/0275377 | A1 * | 9/2014 | Yin | H01B 3/307 525/185 |
| 2017/0190837 | A1 | 7/2017 | Hsieh et al. | |
| 2020/0001573 | A1 | 1/2020 | Saito et al. | |
| 2020/0231804 | A1 * | 7/2020 | Shim | C08L 71/12 |
| 2021/0032404 | A1 * | 2/2021 | Shigaki | B32B 15/20 |

FOREIGN PATENT DOCUMENTS

| | | | | |
|---|---|---|---|---|
| JP | 5649773 | B2 | 1/2015 | |
| TW | 201724126 | A | 7/2017 | |
| WO | 2018/159080 | A1 | 9/2018 | |
| WO | WO-2018212459 | A1 * | 11/2018 | B32B 15/08 |
| WO | WO-2019138992 | A1 * | 7/2019 | B32B 15/08 |

* cited by examiner
† cited by third party

RESIN COMPOSITION, PREPREG OBTAINED USING SAME, RESIN-COATED FILM, RESIN-COATED METAL FOIL, METAL-CLAD LAMINATE, AND WIRING BOARD

TECHNICAL FIELD

The present invention relates to a resin composition, and a prepreg, a film with resin, a metal foil with resin, a metal-clad laminate and a wiring board using the resin composition.

BACKGROUND ART

Over these several years, in various electronic devices, increase in information throughput has led to rapid development in mounting technology such as heightening of integration, densifying of wiring, and multi-layering of a semiconductor device to be mounted. A substrate material for forming a base material of a printed wiring board used in various electronic devices is requested to have low dielectric constant and dielectric loss tangent so as to enhance the transmission rate of signals, and reduce the loss during signal transmission.

Recently, it has been found that maleimide compounds are excellent in dielectric characteristics such as low dielectric constant and low dielectric loss tangent (hereinafter, also referred to as low dielectric characteristics). For example, Patent Literature 1 reports that a resin composition having excellent curability in the presence of oxygen or under low temperature in addition to the characteristics such as low dielectric constant and low dielectric loss tangent is obtained by a curable resin composition containing a vinyl compound, a maleimide compound and a styrene-based thermoplastic elastomer. Although it is assumed that the dielectric characteristics can be improved by adding a styrene-based thermoplastic elastomer having a large molecular weight as compared with the case where such an elastomer is not added, it is easy to imagine that this results in deterioration in the resin fluidity and impairment in the moldability.

When the resin composition is used as a molding material of a substrate material or the like, as characteristics of a cured product of the resin composition, not only excellent low dielectric characteristics, but also high glass transition temperature (Tg), and heat resistance and adhesiveness are required so as to obtain a laminate showing high connection reliability in a wide temperature range. It is also requested to control moisture absorption to a base material of a wiring board by lowering water absorption of the cured product of the molding material so as to make the wiring board usable in a highly humid environment or the like. Further, improvement in the moldability and handleability when the resin composition is made into a prepreg or a film is required.

Meanwhile, with the recent miniaturization and slimming down of electronic device, an electronic component with a surface-mount package has been more often used in electronic devices. In such a semiconductor package or the like, a substrate material having a low coefficient of thermal expansion is required for suppressing warpage of the substrate from the view point of connection reliability and mounting reliability.

This being the case, in the current state, a substrate material for forming a base material of a wiring board is requested to provide a cured product having high glass transition temperature, excellent heat resistance and adhesiveness, low water absorption, low coefficient of thermal expansion, and low dielectric characteristics, and a prepreg, a film with resin, a metal foil with resin and the like containing the resin composition or a semi-cured product thereof are requested to have excellent moldability and excellent handleability.

CITATION LIST

Patent Literature

Patent Literature 1: JP-B2 5649773

SUMMARY OF INVENTION

The present invention was devised in light of the above circumstance, and an object thereof is to provide a resin composition having excellent moldability and handleability in a prepreg, a film with resin, a metal foil with resin, a laminate or the like containing the resin composition or a semi-cured product thereof, and low dielectric characteristics, high heat resistance, high Tg, low coefficient of thermal expansion, adhesiveness, and low water absorption in a cured product of the resin composition. It is also an object of the present invention to provide a prepreg, a film with resin, a metal foil with resin, a metal-clad laminate, and a wiring board using the resin composition.

A resin composition according to one aspect of the present invention includes a modified polyphenylene ether compound having a carbon-carbon unsaturated double bond at a molecular end, a maleimide compound having two or more N-substituted maleimide groups in one molecule, and a liquid styrene-butadiene copolymer having a weight average molecular weight of less than 10000 and having a 1,2-vinyl group.

DESCRIPTION OF EMBODIMENTS

Figure 1:
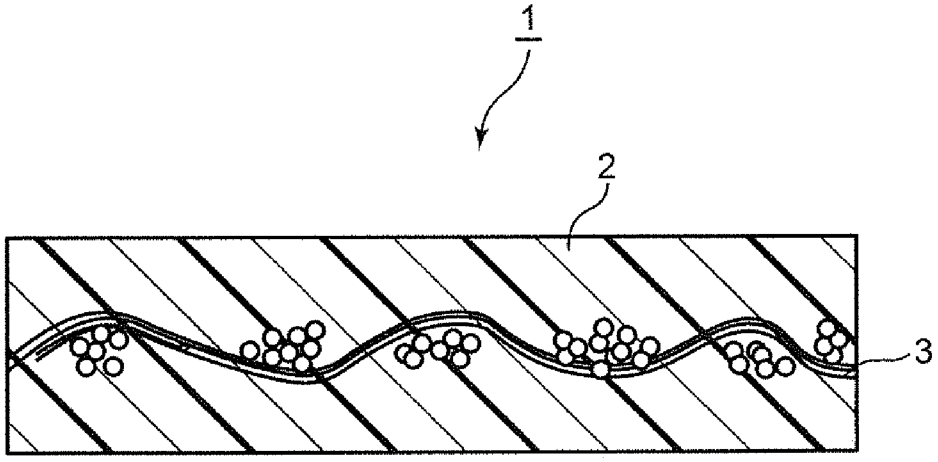
FIG. 1 is a schematic section view showing a configuration of a prepreg according to one embodiment of the present invention.

As described above, a resin composition according to an embodiment of the present invention includes a modified polyphenylene ether compound having a carbon-carbon unsaturated double bond at a molecular end, a maleimide compound having two or more N-substituted maleimide groups in one molecule, and a liquid styrene-butadiene copolymer having a weight average molecular weight of less than 10000 and having a 1,2-vinyl group.

According to such a configuration, it is possible to provide a resin composition having excellent moldability and handleability in a prepreg, a film with resin, a metal foil with resin or the like containing the resin composition or a semi-cured product thereof, and low dielectric characteristics, high heat resistance, high glass transition temperature (Tg), low coefficient of thermal expansion, adhesiveness, and low water absorption in a cured product of the resin composition. Further, according to the present invention, by using the resin composition, it is possible to provide a prepreg, a film with resin, a metal foil with resin, a metal-clad laminate, and a wiring board having excellent properties as described above.

Hereinafter, components of the resin composition according to the present embodiment are specifically described.

Modified Polyphenylene Ether Compound

A modified polyphenylene ether compound used in the present embodiment is not particularly limited as long as it is a modified polyphenylene ether compound that is terminally modified with a substituent having a carbon-carbon unsaturated double bond. Containing such a modified polyphenylene ether compound would result in combination of dielectric characteristics such as low dielectric constant and low dielectric loss tangent, and high heat resistance.

More specific examples of the modified polyphenylene ether compound include modified polyphenylene ether compounds represented by formulas (1) and (2).

[Chemical formula 1]

(1)

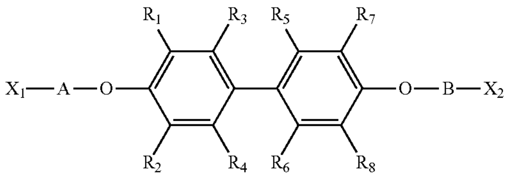

[Chemical formula 2]

(2)

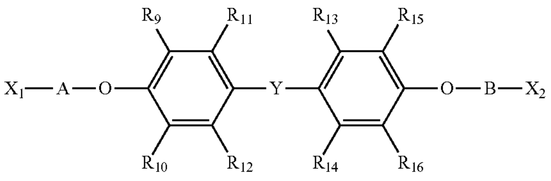

In formulas (1) and (2), $R_1$ to $R_8$ and $R_9$ to $R_{16}$ are independent from each other. That is, $R_1$ to $R_8$ and $R_9$ to $R_{16}$ may be the same group or different groups. $R_1$ to $R_8$, and $R_9$ to $R_{16}$ represent a hydrogen atom, an alkyl group, an alkenyl group, an alkynyl group, a formyl group, an alkylcarbonyl group, an alkenylcarbonyl group, or an alkynylcarbonyl group. Among these, a hydrogen atom and an alkyl group are preferred.

Regarding $R_1$ to $R_8$ and $R_9$ to $R_{16}$, specific examples of the functional groups recited above include the following.

Although the alkyl group is not particularly limited, for example, the alkyl group is preferably an alkyl group having 1 to 18 carbon atoms, and more preferably an alkyl group having 1 to 10 carbon atoms. Specific examples include a methyl group, an ethyl group, a propyl group, a hexyl group, and a decyl group.

Although the alkenyl group is not particularly limited, for example, the alkenyl group is preferably an alkenyl group having 2 to 18 carbon atoms, and more preferably an alkenyl group having 2 to 10 carbon atoms. Specific examples include a vinyl group, an allyl group, and a 3-butenyl group.

Although the alkynyl group is not particularly limited, for example, the alkynyl group is preferably an alkynyl group having 2 to 18 carbon atoms, and more preferably an alkynyl group having 2 to 10 carbon atoms. Specific examples include an ethynyl group, and a prop-2-yn-1-yl group (propargyl group).

Although the alkylcarbonyl group is not particularly limited as long as it is a carbonyl group substituted with an alkyl group, for example, the alkylcarbonyl group is preferably an alkylcarbonyl group having 2 to 18 carbon atoms, and more preferably an alkylcarbonyl group having 2 to 10 carbon atoms. Specific examples include an acetyl group, a propionyl group, a butyryl group, an isobutyryl group, a pivaloyl group, a hexanoyl group, an octanoyl group, and a cyclohexylcarbonyl group.

Although the alkenylcarbonyl group is not particularly limited as long as it is a carbonyl group substituted with an alkenyl group, for example, the alkenylcarbonyl group is preferably an alkenylcarbonyl group having 3 to 18 carbon atoms, and more preferably an alkenylcarbonyl group having 3 to 10 carbon atoms. Specific examples include an acryloyl group, a methacryloyl group and a crotonoyl group.

Although the alkynylcarbonyl group is not particularly limited as long as it is a carbonyl group substituted with an alkynyl group, for example, the alkynylcarbonyl group is preferably an alkynylcarbonyl group having 3 to 18 carbon atoms, and more preferably an alkynylcarbonyl group having 3 to 10 carbon atoms. Specific examples include a propioloyl group.

In formulas (1) and (2), A and B are structures respectively shown by formulas (3) and (4), as described above.

[Chemical formula 3]

(3)

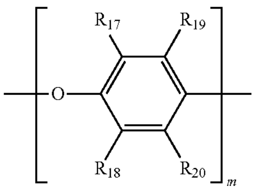

[Chemical formula 4]

(4)

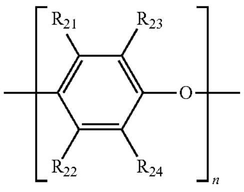

In formulas (3) and (4), m and n which are repeating units respectively represent an integer of 1 to 50.

$R_{17}$ to $R_{20}$ and $R_{21}$ to $R_{24}$ are independent from each other. That is, $R_{17}$ to $R_{20}$ and $R_{21}$ to $R_{24}$ may be the same group or different groups. In the present embodiment, $R_{17}$ to $R_{20}$ and $R_{21}$ to $R_{24}$ each represent a hydrogen atom or an alkyl group.

Further, in formula (2), examples of Y include linear, branched or cyclic hydrocarbons having 20 or less carbon atoms. More specifically, examples include structures represented by formula (5).

[Chemical formula 5]

(5)

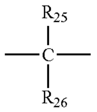

In formula (5), $R_{25}$ and $R_{26}$ each independently represent a hydrogen atom or an alkyl group. Examples of the alkyl group include a methyl group. Examples of the group represented by formula (5) include a methylene group, a methylmethylene group, and a dimethylmethylene group.

In formulas (1) and (2), it is preferred that $X_1$ and $X_2$ each independently represent a substituent having a carbon-carbon unsaturated double bond as represented by formula (6) or (7). $X_1$ and $X_2$ may be same or different from each other.

[Chemical formula 6]

(6)

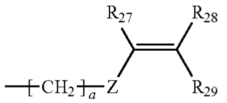

[Chemical formula 7]

(7)

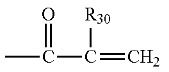

In formula (6), a represents an integer of 0 to 10. In formula (7), when a is 0, Z represents a moiety directly binding with a terminal of polyphenylene ether.

In formula (6), Z represents an arylene group. The arylene group is not particularly limited. Specific examples include monocyclic aromatic groups such as a phenylene group, and polycyclic aromatic groups in which the aromatic ring is not monocyclic but is polycyclic aromatic such as a naphthalene ring. The arylene group includes derivatives in which the hydrogen atom binding to the aromatic ring is substituted with a functional group such as an alkenyl group, an alkynyl group, a formyl group, an alkylcarbonyl group, an alkenylcarbonyl group, or an alkynylcarbonyl group.

In formula (6), $R_{27}$ to $R_{29}$ each may independently be the same group or different groups, and each represent a hydrogen atom or an alkyl group. The alkyl group is not particularly limited, and, for example, the alkyl group is preferably an alkyl group having 1 to 18 carbon atoms, and more preferably an alkyl group having 1 to 10 carbon atoms. Specific examples include a methyl group, an ethyl group, a propyl group, a hexyl group, and a decyl group.

Preferred specific examples of the substituent represented by formula (6) include functional groups including a vinylbenzyl group.

In formula (7), $R_{30}$ represents a hydrogen atom or an alkyl group. The alkyl group is not particularly limited, and, for example, the alkyl group is preferably an alkyl group having 1 to 18 carbon atoms, and more preferably an alkyl group having 1 to 10 carbon atoms. Specific examples include a methyl group, an ethyl group, a propyl group, a hexyl group, and a decyl group.

More specific examples of the substituents $X_1$ and $X_2$ in the present embodiment include vinylbenzyl groups (ethenylbenzyl group) such as a p-ethenylbenzyl group and an m-ethenylbenzyl group, a vinylphenyl group, an acrylate group, and a methacrylate group.

Use of the modified polyphenylene ether compounds represented by formulas (1) and (2) would result in combination of excellent heat resistance in addition to low dielectric characteristics such as low dielectric constant and low dielectric loss tangent, and high Tg and adhesiveness.

The modified polyphenylene ether compounds represented by formulas (1) and (2) may be used singly or in combination of two or more kinds.

In the present embodiment, although not particularly limited, for example, the weight average molecular weight (Mw) of the modified polyphenylene ether compound is preferably 1000 to 5000, and more preferably 1000 to 4000. The weight average molecular weight can be measured by an ordinary molecular weight measuring method, and is specifically, a value measured by gel permeation chromatography (GPC) and so on are recited. When the modified polyphenylene ether compound has a repeating unit (s, m, n) in the molecule, it is preferred that the repeating unit is a numerical value with which the weight average molecular weight of the modified polyphenylene ether compound falls within the above range.

When the weight average molecular weight of the modified polyphenylene ether compound falls within the above range, excellent low dielectric characteristics peculiar to the polyphenylene ether is endowed, and more excellent resistance of the cured product, and excellent moldability are achieved. This would owe to the following reasons. In a normal polyphenylene ether, a polyphenylene ether having a weight average molecular weight falling within the above range has a relatively low molecular weight, so that the heat resistance of the cured product of the polyphenylene ether tends to decrease. In this respect, the modified polyphenylene ether compound according to the present embodiment has an unsaturated double bond at a terminal, and has high reactivity, and thus the cured product would have sufficiently high heat resistance. When the weight average molecular weight of the modified polyphenylene ether compound falls within the above range, the modified polyphenylene ether compound has relatively low molecular weight, and has low melt viscosity and excellent moldability would be achieved. Therefore, such a modified polyphenylene ether compound would give excellent moldability and appearance as well as more excellent heat resistance of the cured product.

An average number of substituents (the number of terminal functional groups) in a molecule terminal per one molecule of the modified polyphenylene ether in the modified polyphenylene ether compound used in the present embodiment is not particularly limited. Specifically, the average number of substituents is preferably 1 to 5, and more preferably 1 to 3. If the number of terminal functional groups is too small, there is a tendency that Tg decreases, and sufficient heat resistance of the cured product is difficult to be obtained. If the number of terminal functional groups is too large, the reactivity is too high, and, for example, the problems of deterioration in storage stability of the resin composition, and deterioration in fluidity of the resin composition can occur due to increase in melt viscosity. That is, when such a modified polyphenylene ether is used, for example, molding defect such as generation of voids can occur at the time of multi-layer molding due to the insufficient fluidity or the like, and this can cause the problem in moldability of difficulty in obtaining a reliable printed wiring board.

The number of terminal functional groups of the modified polyphenylene ether compound can be a numerical value showing an average number of substituents per one molecule of all the modified polyphenylene ether compound existing in 1 mole of the modified polyphenylene ether compound. The number of terminal functional groups can be determined, for example, by measuring the number of hydroxyl groups remaining in the obtained modified polyphenylene ether compound, and calculating a decrement from the number of hydroxyl groups of the polyphenylene ether before modification. The decrement from the number of hydroxyl groups of the polyphenylene ether before modification is the number of terminal functional groups. The method for measuring the number of hydroxyl groups remaining in the modified polyphenylene ether compound may include adding a quaternary ammonium salt that associates with a hydroxyl group (tetraethylammonium hydroxide) to a solution of the modified polyether ether compound, and measuring the UV absorbance of the mixed solution.

Also, the intrinsic viscosity of the modified polyphenylene ether compound used in the present embodiment is not particularly limited. Specifically, the intrinsic viscosity may be 0.03 to 0.12 dl/g, preferably 0.04 to 0.11 dl/g, and more preferably 0.06 to 0.095 dl/g. If the intrinsic viscosity is too low, the molecular weight tends to be low, and low dielectricity such as low dielectric constant and low dielectric loss tangent tends to be difficult to be obtained. If the intrinsic viscosity is too high, the viscosity is high, and sufficient fluidity is not obtained, and the moldability of the cured product tends to decrease. Therefore, when the intrinsic viscosity of the modified polyphenylene ether compound falls within the above range, excellent heat resistance and moldability of the cured product can be realized.

Here, the intrinsic viscosity is an intrinsic viscosity measured in methylene chloride at 25° C., and more specifically, for example, a measurement value of a 0.18 g/45 ml methylene chloride solution (liquid temperature 25° C.) measured with a viscometer. As the viscometer, for example, AVS500 Visco System available from Schott can be recited.

A method for synthesizing the modified polyphenylene ether compound preferably used in the present embodiment is not particularly limited as long as a modified polyphenylene ether compound that is terminally modified with substituents $X_1$ and $X_2$ as described above can be synthesized. Specifically, a method of reacting a compound in which substituents $X_1$ and $X_2$ and a halogen atom are bound, with polyphenylene ether can be recited.

The polyphenylene ether that is a starting material is not particularly limited as long as a specific modified polyphenylene ether can be finally synthesized. Specific examples include a polyphenylene ether composed of 2,6-dimethylphenol, and at least one of a bifunctional phenol and a trifunctional phenol, and those based on polyphenylene ether, such as poly(2,6-dimethyl-1,4-phenylene oxide). The bifunctional phenol means a phenol compound having two phenolic hydroxyl groups in each molecule, and, for example, tetramethylbisphenol A can be recited. The trifunctional phenol means a phenol compound having three phenolic hydroxyl groups in each molecule.

As one example of a method for synthesizing a modified polyphenylene ether compound, for example, in the case of the modified polyphenylene ether compound represented by formula (2), specifically, a polyphenylene ether as described above, and a compound in which substituents $X_1$ and $X_2$ and a halogen atom are bound (compound having substituents $X_1$ and $X_2$) are dissolved in the solvent and stirred. Thus, the polyphenylene ether, and the compound having substituents $X_1$ and $X_2$ react, and the modified polyphenylene ether represented by formula (2) in the present embodiment is obtained.

It is preferred that the reaction is conducted in the presence of an alkali metal hydroxide. This would allow desired progression of the reaction. This is ascribable to that the alkali metal hydroxide functions as a dehalogenation agent, specifically as a dehydrochlorination agent. In other words, the alkali metal hydroxide eliminates hydrogen halide from the compound having a phenol group of polyphenylene ether and substituent X, and thus the substituents $X_1$ and $X_2$ would bind to the oxygen atom of the phenol group in place of the hydrogen atom of the phenol group of the polyphenylene ether.

Although the alkali metal hydroxide is not particularly limited as long as it can serve as a dehalogenation agent, for example, sodium hydroxide is recited. The alkali metal hydroxide is usually used in the form of an aqueous solution, and specifically, used in the form of a sodium hydroxide aqueous solution.

The reaction conditions including the reaction time and the reaction temperature differ depending on the compound having substituents $X_1$ and $X_2$, and are not particularly limited as long as the aforementioned reaction progresses desirably. Specifically, the reaction temperature is preferably room temperature to 100° C., more preferably 30 to 100° C. The reaction time is preferably 0.5 to 20 hours, and more preferably 0.5 to 10 hours.

The solvent used in the reaction is not particularly limited as long as it can dissolve polyphenylene ether, and the compound having substituents $X_1$ and $X_2$, and does not inhibit reaction between the polyphenylene ether, and the compound having substituents $X_1$ and $X_2$. Specific examples include toluene.

It is preferred that the aforementioned reaction is conducted in the presence of a phase transfer catalyst in addition to the alkali metal hydroxide. In other words, it is preferred that the aforementioned reaction is conducted in the presence of an alkali metal hydroxide and a phase transfer catalyst. This would allow more desired progression of the reaction. This would owe to the following reasons. This is ascribable to that the phase transfer catalyst is a catalyst that has a function of taking in the alkali metal hydroxide, and is soluble both in a phase of a polar solvent such as water, and in a phase of a nonpolar solvent such as an organic solvent, and is movable between these phases. Specifically, in the case where a sodium hydroxide aqueous solution is used as an alkali metal hydroxide, and an organic solvent such as toluene that is immiscible to water is used as a solvent, the solvent and the sodium hydroxide aqueous solution separate from each other even when the sodium hydroxide aqueous solution is dropped to the solvent being subjected to the reaction, and sodium hydroxide is difficult to migrate to the solvent. In such a case, the sodium hydroxide aqueous solution added as the alkali metal hydroxide would be less likely to contribute to acceleration of the reaction. On the other hand, when the reaction is conducted in the presence of the alkali metal hydroxide and the phase transfer catalyst, the alkali metal hydroxide migrates to the solvent while the alkali metal hydroxide is taken in the phase transfer catalyst, and the sodium hydroxide aqueous solution would be more likely to contribute to acceleration of the reaction. Therefore, the reaction would progress more desirably when the reaction is conducted in the presence of the alkali metal hydroxide and the phase transfer catalyst.

Although the phase transfer catalyst is not particularly limited, for example, quaternary ammonium salts such as tetra-n-butylammonium bromide are recited.

It is preferred that the resin composition according to the present embodiment contains a modified polyphenylene ether obtained in the manner as described above as the modified polyphenylene ether.

Maleimide Compound

Next, a maleimide compound used in the present embodiment is described. The maleimide compound used in the present embodiment is not particularly limited as long as it is a maleimide compound having two or more N-substituted maleimide groups in one molecule. Since such a maleimide compound efficiently reacts with the modified polyphenylene ether compound, high heat resistance is obtained. The maleimide compound contributes to high Tg, low CTE (coefficient of thermal expansion) and low dielectric characteristics in a cured product of the resin composition.

Although a functional group equivalent of the maleimide group of the maleimide compound used in the present embodiment is not particularly limited, the functional group equivalent is desirably 130 to 500 g/eq., more desirably 200 to 500 g/eq., and further desirably 230 to 400 g/eq. When the functional group equivalent falls within the above range, Tg of the cured product would be increased, and water absorption would be lowered more reliably.

Although the above-described maleimide compound is not particularly limited, more specifically, maleimide compounds represented by formulas (8) to (15) are recited as preferred examples. These may be used singly or in combination of two or more kinds.

[Chemical formula 8]

(8)

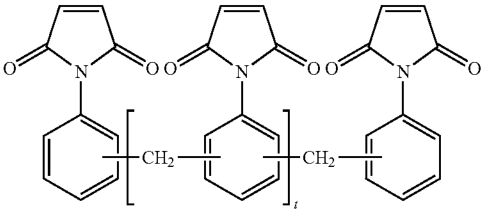

In formula (8), t, which is a repeating unit, is 0.1 to 10.

[Chemical formula 9]

(9)

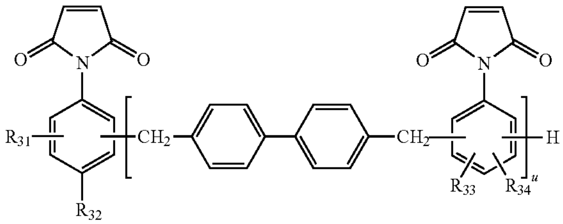

In formula (9), u, which is a repeating unit, is an average value, and is more than 1 and 5 or less. $R_{31}$ to $R_{34}$ each independently represent a group selected from the group consisting of a hydrogen atom, an alkyl group having 1 to 5 carbon atoms, and a phenyl group.

[Chemical formula 10]

(10)

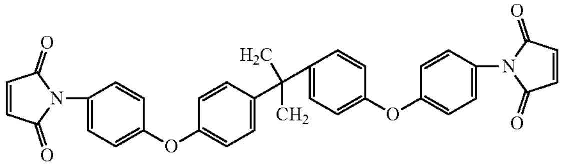

[Chemical formula 11]

(11)

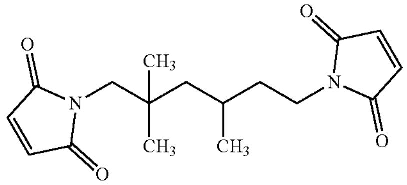

[Chemical formula 12]

(12)

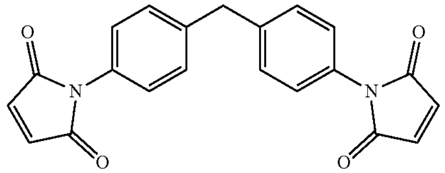

[Chemical formula 13]

(13)

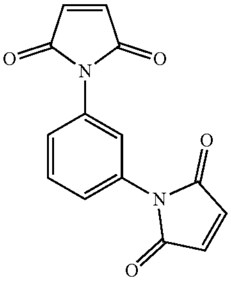

[Chemical formula 14]

(14)

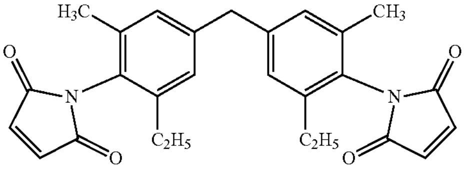

[Chemical formula 15]

(15)

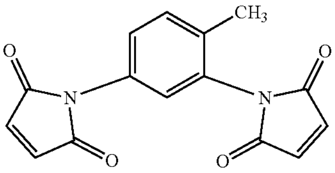

As such a maleimide compound, a commercially available product may be used, and for example, BMI-4000, BMI-2300, BMI-TMH and the like available from Daiwakasei Industry Co., Ltd., or MIR-3000 and the like available from Nippon Kayaku Co., Ltd. may be used.

The content of the maleimide compound is preferably 5 to 50 parts by mass per 100 parts by mass of a total of the modified polyphenylene ether compound, the maleimide compound, and the styrene-butadiene copolymer. By containing the maleimide compound within the above range, high Tg and low water absorption would be achieved more reliably. More preferably, the content of the maleimide compound is 5 to 40 parts by mass, and further desirably, 10 to 40 parts by mass.

Styrene-Butadiene Copolymer

Next, a liquid styrene-butadiene copolymer having a weight average molecular weight of less than 10000 and having a 1,2-vinyl group used in the present embodiment is described.

The styrene-butadiene copolymer of the present embodiment is not particularly limited as long as it has a weight average molecular weight of less than 10000 and has a 1,2-vinyl group.

Such a styrene-butadiene copolymer is hydrophobic, and has less polar groups. Therefore, it is considered that the low dielectric characteristics can be improved and the water absorption can be reduced by addition of the styrene-butadiene copolymer to the resin composition of the present embodiment. Further, since the styrene-butadiene copolymer has a styrene skeleton, it moderately mingles with the modified polyphenylene ether and the maleimide compound to give a cured product without causing bleeding. Further, since the styrene-butadiene copolymer has a butadiene skeleton which is an aliphatic skeleton, the modulus of elasticity of the cured product of the resin composition with the modified polyphenylene ether and the maleimide compound is reduced, and the thermal expansion in the plane direction in a resultant laminate is suppressed, leading to an advantageous effect of reducing warpage of a substrate in a package substrate or the like.

Although the molecular weight is not particularly limited as long as the weight average molecular weight is less than 10000, the molecular weight is preferably 1000 or more from the viewpoints of solvent solubility, fluidity, tackiness, heat resistance, and the like. More preferably, the weight average molecular weight is 3000 or more and less than 10000. Since the styrene-butadiene copolymer of the present embodiment has a molecular weight of as low as less than 10000, it has low viscosity, and can increase the resin fluidity and improve the moldability in a resin composition prepared therewith. Further, since the styrene-butadiene copolymer of the present embodiment has a relatively small molecular weight, it shows high solubility in a polar organic solvent such as methylethylketone as well as in a nonpolar organic solvent such as toluene although it has a hydrophobic skeleton. Therefore, the styrene-butadiene copolymer is easy to dissolve in various solvents in preparation of a resin composition, and is advantageous in that excellent varnish stability is achieved when it is dissolved in a solvent to prepare resin varnish. In the resin composition of the present embodiment, it is possible to easily prepare resin vanish using the maleimide that is difficult to dissolve in a nonpolar solvent because of having a polar group, and methyl ethyl ketone that is a polar solvent.

In the present embodiment, the weight average molecular weight of the styrene-butadiene copolymer can be determined, for example, by absolute molecular weight measurement, or gel permeation chromatography (GPC) using monodisperse polybutadiene as a standard substance.

Also, since the styrene-butadiene copolymer of the present embodiment is liquid, the flexibility of the resin composition of the present embodiment advantageously improves, and the handleability (dust fall or the like) of the resin composition in a semi-cured state advantageously improves.

Particularly preferred is a styrene-butadiene copolymer having a cross-linkable 1,2-vinyl in the molecule, and such a styrene-butadiene copolymer is reactive compared with a general styrene-butadiene polymer having abundant 1,4-bonds in the main chain. Also, since the styrene-butadiene copolymer has a molecular weight of as low as less than 10000 by number average molecular weight, it is considered that the reactivity of 1,2-vinyl groups in the styrene-butadiene copolymer is still higher. It is considered that these contribute to the curing reaction, and provide excellent appearance after molding without causing bleeding of the resin.

More specific examples include a styrene-butadiene copolymer having a structure represented by formula (16).

[Chemical formula 16]

(16)

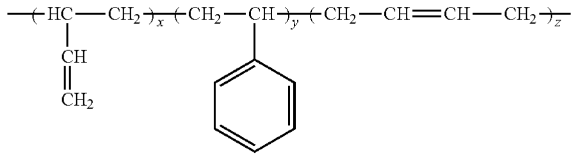

The formula (16) is one example of a styrene-butadiene copolymer that can be used in the present embodiment, and x represents a 1,2-vinyl group, y represents a styrene group, and z represents a 1,4-bond.

As a structural unit having a 1,2-vinyl group, for example, the following structural unit is recited; as a structural unit having a 1,4-bond, for example, a structural unit of the following formula (II) is recited, and as a styrene group, for example, a structural unit of the following formula (III) is recited.

[Chemical formula 17]

(I)

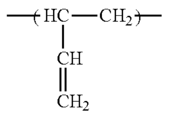

[Chemical formula 18]

$$-\!(CH_2-CH=CH-CH_2)\!- \quad (II)$$

[Chemical formula 19]

(III)

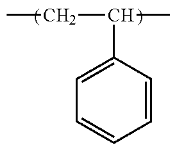

In the present embodiment, as the styrene-butadiene copolymer having a 1, 2-vinyl group, the one having a repetitive structure of the structural unit of (I) and a repetitive structure of the structural unit of (III) is preferred. Further, a repetitive structure of the structural unit of (II) may be contained.

Also, in the styrene-butadiene copolymer of the present embodiment, it is preferred that a styrene content in the molecule is 50% by mass or less, and a butadiene content in the molecule is 50% by mass or more, and it is more preferred that the styrene content is 20 to 50% by mass, and the butadiene content is 50 to 80% by mass. In other words, it is preferred that the relationships among x, y, and z shown in the formula (16) are:

$$y/(x+y+z) = 20 \text{ to } 50\%, \text{ and}$$

$$(x+z)/(x+y+z) = 50 \text{ to } 80\%.$$

It is considered that the styrene content falling within the above range enables the modified polyphenylene ether and the maleimide compound to moderately mingle with each other to give a cured product more reliably without causing bleeding, and thus it is possible to obtain an excellent resin composition achieving high Tg and adhesiveness in good balance. It is also considered that the butadiene content falling within the above range can reduce the modulus of elasticity of the resin composition more reliably, and thus can reduce the CTE in the plane direction in a laminate prepared with the resin composition. If CTE in the plane direction can be reduced, warpage of a substrate can be reduced in a package substrate or the like.

In the present embodiment, the contents of styrene and butadiene in the styrene-butadiene copolymer can be determined, for example, by nuclear magnetic resonance spectroscopy (NMR).

Further, in the styrene-butadiene copolymer of the present embodiment, it is preferred that a 1,2-vinyl content in butadiene is 30 to 70%. In other words, it is preferred that the relationship between x and z shown in the formula (16) is:

$$x/(x+z) = 30 \text{ to } 70\%.$$

It is considered that this further contributes to a curing reaction and makes it possible to obtain a resin composition that is excellent in appearance after molding without causing bleeding of the resin.

In the present embodiment, the content of the 1,2-vinyl group in butadiene of the styrene-butadiene copolymer can be determined, for example, by infrared absorption spectrometry (Morello method).

The styrene-butadiene copolymer of the present embodiment can be synthesized, for example, by copolymerizing a styrene monomer and a 1,3-butadiene monomer. Alternatively, a commercially available product may be used, and specific examples of the product include "Ricon 181", "Ricon 100", and "Ricon 184" available from CRAY VALLEY.

The content of the styrene-butadiene copolymer is preferably 5 to 50 parts by mass per 100 parts by mass of a total of the modified polyphenylene ether compound, the maleimide compound, and the styrene-butadiene copolymer. It is considered that by containing the styrene-butadiene copolymer in such a range, low dielectric characteristics, low coefficient of thermal expansion, high moldability, and high adhesiveness can be achieved more reliably. The content of the styrene-butadiene copolymer is more preferably 5 to 30 parts by mass, and further desirably 5 to 20 parts by mass.

Content Ratio of Components

In the resin composition of the present embodiment, the content ratio between the modified polyphenylene ether compound and the maleimide compound is 95:5 to 40:60 in a mass ratio. If the ratio of the content of the modified polyphenylene ether compound is smaller than the above, there is a possibility that adhesion with a copper foil decreases. On the other hand, if the ratio of the content of the maleimide compound is smaller than the above, there is a possibility that Tg decreases.

The range of content ratio between the modified polyphenylene ether compound and the maleimide compound is more preferably 90:10 to 50:50.

Other Components

The resin composition according to the present embodiment may further contain other component besides the modified polyphenylene ether compound, the maleimide compound, and the styrene-butadiene copolymer.

For example, the resin composition according to the present embodiment may further contain a filler. Examples of the filler include, but are not limited to, those added for enhancing the heat resistance and the incombustibility of the cured product of the resin composition. By containing the filler, it is possible to further enhance the heat resistance, the incompatibility, and so on. Specific examples of the filler include metal oxides including silica such as spherical silica, alumina, titanium oxide, and mica, metal hydroxides such as aluminum hydroxide, and magnesium hydroxide, talc, aluminum borate, barium sulfate, and calcium carbonate. Among these, silica, mica, and talc are preferred, and spherical silica is more preferred as the filler. The filler may be used singly or in combination of two or more kinds. The filler may be used as it is, or may be used while it is surface-treated with a silane coupling agent of epoxy silane type, vinyl silane type, methacryl silane type, or amino silane type. The silane coupling agent may be added by an integral blending method rather than by the method of preliminarily subjecting the filler to a surface treatment.

When the filler is contained, the content of the filler is preferably 10 to 200 parts by mass, more preferably 30 to 150 parts by mass per 100 parts by mass of a total of the organic component (the modified polyphenylene ether compound, the maleimide compound, and the styrene-butadiene copolymer).

The resin composition of the present embodiment may further contain a flame retardant, and examples of the flame retardant include halogen-based flame retardants such as a bromine-based flame retardant, and phosphorus-based flame retardants. Specific examples of the halogen-based flame retardants include bromine-based flame retardants such as pentabromodiphenylether, octabromodiphenylether, decabromodiphenylether, tetrabromobisphenol A, and hexabromocyclododecane, and chlorine-based flame retardants such as chlorinated paraffin. Specific examples of the phosphorus-based flame retardants include phosphate esters such as condensed phosphate esters, and cyclic phosphate esters, phosphazene compounds such as cyclic phosphazene compounds, phosphinate-based flame retardants such as phosphinic acid metal salts such as dialkylphosphinic acid aluminum salts, melamine-based flame retardants such as melamine phosphate and melamine polyphosphate, and phosphine oxide compounds having a diphenylphosphine oxide group. The flame retardant may be used singly or in combination of two or more kinds from the exemplified flame retardants.

Further, the resin composition according to the present embodiment may further include additives besides the above. Examples of the additives include an antifoaming agent such as a silicone-based antifoaming agent and an acrylate ester-based antifoaming agent, a heat stabilizer, an antistatic agent, a ultraviolet absorber, a dye, a pigment, a lubricant, and a dispersing agent such as a wetting and dispersing agent.

The resin composition according to the present embodiment may further contain a reaction initiator. Although the curing reaction can proceed only by the modified polyphenylene ether compound, the maleimide compound, and the styrene-butadiene copolymer, a reaction initiator may be added because it is sometimes difficult to raise the temperature to temperatures at which the curing proceeds depending on the process conditions. The reaction initiator is not particularly limited as long as it can accelerate the curing reaction among the modified polyphenylene ether compound, the maleimide compound, and the styrene-butadiene copolymer. Specific examples include oxidizing agents such as α,α'-bis(t-butylperoxy-m-isopropyl)benzene, 2,5-dimethyl-2,5-di(t-butylperoxy)-3-hexyne, benzoyl peroxide, 3,3',5,5'-tetramethyl-1,4-diphenoquinone, chloranil, 2,4,6-tri-t-butylphenoxyl, t-butylperoxyisopropylmonocarbonate, and azobisisobutyronitrile. Also, a carboxylic acid metal salt or the like can be used together as needed. This further accelerates the curing reaction. Among these, α,α'-bis(t-butylperoxy-m-isopropyl)benzene is preferably used. Since α,α'-bis(t-butylperoxy-m-isopropyl)benzene has a relatively high reaction initiation temperature, it is possible to control acceleration of the curing reaction when curing is not required, for example at the time of drying of a prepreg, and it is possible to control deterioration in storage stability of the resin composition. Further, since α,α'-bis(t-butylperoxy-m-isopropyl)benzene has low volatility, volatilization does not occur at the time of drying or during storage of a prepreg, a film or the like, and excellent stability is achieved. The reaction initiator may be used singly or in combination of two or more kinds. Regarding the content, the reaction initiator is used such that an adding amount of the reaction initiator is 0.1 to 2 parts by mass per 100 parts by mass of a total of the modified polyphenylene ether compound, the maleimide compound, and the styrene-butadiene copolymer.

Prepreg, Film with Resin, Metal-Clad Laminate, Wiring Board, and Metal Foil with Resin Next, a prepreg, a metal-clad laminate, a wiring board, and a metal foil with resin using the resin composition of the present embodiment are described. In the following description, 1 denotes a prepreg, 2 denotes a resin composition or a semi-cured product of the resin composition, 3 denotes a fibrous base material, 11 denotes a metal-clad laminate, 12 denotes an insulating layer, 13 denotes a metal foil, 14 denotes wiring, 21 denotes a wiring board, 31 denotes a metal foil with resin, 32 and 42 denote resin layers, 41 denotes a film with resin, and 43 denotes a support film.

FIG. 1 is a schematic section view showing one example of the prepreg 1 according to an embodiment of the present invention.

As shown in FIG. 1, the prepreg 1 according to the present embodiment includes the resin composition or the semi-cured product of the resin composition 2, and the fibrous base material 3.

In one example of the prepreg 1, the fibrous base material 3 exists in the resin composition or the semi-cured product thereof 2. That is, the prepreg 1 includes the resin composition or the semi-cured product thereof, and the fibrous base material 3 existing in the resin composition or the semi-cured product thereof 2.

In the present embodiment, "semi-cured product" means a product in the state that the resin composition is cured halfway to such an extent that the resin composition can be further cured. That is, the semi-cured product is in such a state that the resin composition is semi-cured (B-staged). For example, as the resin composition is heated, the resin composition gradually becomes less viscous in the beginning, and then starts curing, and gradually becomes more viscous. In such a case, as a "semi-cured" state, the state before completion of curing after starting of increase in viscosity can be recited.

A prepreg obtained by using the resin composition according to the present embodiment may include the semi-cured product of the resin composition, or may include the resin composition itself that is not cured. That is, the prepreg may be a prepreg including the semi-cured product of the resin composition (the resin composition in B stage) and a fibrous base material, or may be a prepreg including the resin composition before curing (the resin composition in A stage) and a fibrous base material. Specific examples include prepregs in which the fibrous base material exists in the resin composition. The resin composition or the semi-cured product thereof may be the resin composition that is heat dried.

The resin composition according to the present embodiment is often prepared into varnish, and used as resin varnish in production of the prepreg, or the later-described metal foil with resin, metal-clad laminate, and so on. Such resin varnish is prepared, for example, in the following manner.

First, components that are soluble in an organic solvent, such as a modified polyphenylene ether compound, a maleimide compound, a styrene-butadiene copolymer, and a reaction initiator, are introduced and dissolved in the organic solvent. At this time, heating may be conducted as needed. Then, a component that is insoluble in the organic solvent, for example, an inorganic filler is added, and then the component is dispersed until a predetermined dispersed state is achieved with a ball mill, a beads mill, a planetary mixer, a roll mill or the like, and thus a varnishy resin composition is prepared. The organic solvent used herein is not particularly limited as long as it dissolves the modified polyphenylene ether compound, the maleimide compound, the styrene-butadiene copolymer and so on, and it does not inhibit the curing reaction. Specific examples include toluene, methylethylketone, cyclohexanone, and propylene glycol monomethyl ether acetate. These may be used singly or in combination of two or more kinds.

The resin varnish of the present embodiment is advantageous in that it is excellent in storage stability, and it is excellent in film flexibility, film formability, and impregnating ability to glass cloth, and it is easy to handle.

As a method for producing the prepreg 1 of the present embodiment using the varnishy resin composition of the present embodiment, for example, a method of impregnating the fibrous base material 3 with the resin varnishy resin composition 2, followed by drying is recited.

Specific examples of the fibrous base material used in producing a prepreg include glass cloth, aramid cloth, polyester cloth, LCP (liquid crystal polymer) nonwoven fabric, glass nonwoven fabric, aramid nonwoven fabric, polyester nonwoven fabric, pulp paper, and linter paper. A laminate having excellent mechanical strength is obtained by using glass cloth, and in particular, glass cloth that is subjected to a flattening process is preferred. Although the glass cloth for use in the present embodiment is not particularly limited, for example, glass cloth having low dielectric constant such as E glass, S glass, NE glass, Q glass, and L glass can be recited. The flattening process can be performed, specifically, for example, by compressing yarns into flat by continuously pressurizing the glass cloth at an appropriate pressure by means of a press roll. As the fibrous base material, for example, those having a thickness of 0.01 to 0.3 mm can be generally used.

Impregnation of the fibrous base material 3 with the resin varnish (resin composition 2) is performed by dipping, coating and so on. The impregnation can be repeated plural times as needed. In this case, by repeating impregnation using a plurality of resin varnishes having different compositions or concentrations, a desired composition (content ratio) and a desired resin amount can be eventually achieved.

The fibrous base material 3 impregnated with the resin varnish (resin composition 2) is heated in desired heating conditions, for example, at 80° C. or more and 180° C. or less for 1 minute or more and 10 minutes or less. The solvent is volatilized from the varnish by heating, and the solvent is reduced or removed to give the prepreg 1 before curing (A stage) or in a semi-cured state (B stage).

Figure 4:
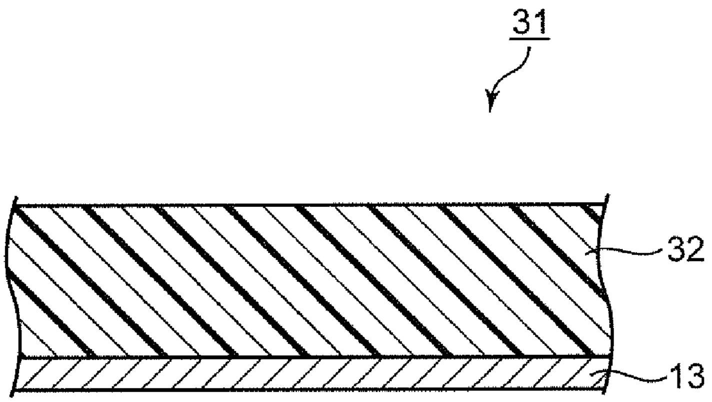
FIG. 4 is a schematic section view showing a configuration of a metal foil with resin according to one embodiment of the present invention.

Also, as shown in FIG. 4, the metal foil with resin 31 of the present embodiment has such a configuration that the resin layer 32 containing the aforementioned resin composition or the semi-cured product of the resin composition, and the metal foil 13 are laminated. That is, the metal foil with resin of the present embodiment may be a metal foil with resin including a resin layer containing the resin composition before curing (the resin composition of A stage), and a metal foil, or may be a metal foil with resin including a resin layer containing the semi-cured product of the resin composition (the resin composition of B stage), and a metal foil.

As a method for producing the metal foil with resin 31, for example, a method of coating the surface of the metal foil 13 such as a copper foil with the aforementioned resin varnishy resin composition, followed by drying is recited. Examples of the coating method include a bar coater, a comma coater, a die coater, a roll coater, and a gravure coater.

As the metal foil 13, metal foils used in a metal-clad laminate or a wiring board can be used without limitation, and for example, copper foil, aluminum foil, and so on are recited.

Figure 5:
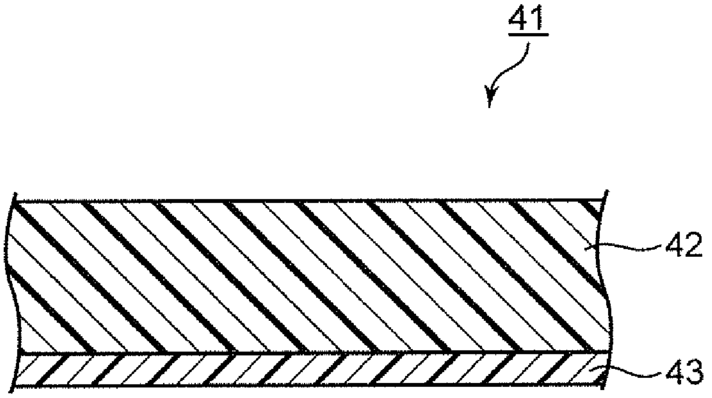
FIG. 5 is a schematic section view showing a configuration of a resin film according to one embodiment of the present invention.

Further, as shown in FIG. 5, the film with resin 41 of the present embodiment has such a configuration that the resin layer 42 containing the aforementioned resin composition or the semi-cured product of the resin composition, and the film support base material 43 are laminated. That is, the film with resin of the present embodiment may be a film with resin containing the resin composition before curing (the resin composition of A stage), and a film support base material, or may be a film with resin containing the semi-cured product of the resin composition (the resin composition of B stage), and a film support base material.

As a method for producing the film with resin 41, for example, the surface of the film support base material 43 is coated with the aforementioned resin varnishy resin composition, and then the solvent is volatilized from the varnish to reduce or remove the solvent, and thus a film with resin before curing (A stage) or in the semi-cured state (B stage) can be obtained.

Examples of the film support base material include electric insulating films such as a polyimide film, a PET (polyethylene terephthalate) film, a polyester film, a polyparabanic acid film, a polyetherether ketone film, a polyphenylene sulfide film, an aramid film, a polycarbonate film, and a polyarylate film.

Also in the film with resin and the metal foil with resin of the present embodiment, the resin composition or the semi-cured product thereof may be the resin composition that is dried or heat dried as with the case of the prepreg described above.

The thickness and so on of the metal foil 13 and the film support base material 43 can be appropriately set in accordance with the desired purpose. For example, as the metal foil 13, those having a thickness of about 0.2 to 70 μm can be used. When the thickness of the metal foil is, for example, 10 μm or less, a copper foil with a carrier, having a release layer and a carrier for improvement in handleability may be employed. Application of the resin varnish to the metal foil 13 or the film support base material 43 is performed by coating or the like, and the coating may be repeated plural times as needed. In this case, by repeating coating using a plurality of resin varnishes having different compositions or concentrations, a desired composition (content ratio) and a desired resin amount can be eventually achieved.

Although the drying or heat drying conditions in the production method of the metal foil with resin 31 or the resin film 41 are not particularly limited, the metal foil 13 or the film support base material 43 is coated with the resin varnishy resin composition, and then heating is conducted at desired heating conditions, for example, at 80 to 170° C. for about 1 to 10 minutes to volatilize the solvent from the varnish to reduce or remove the solvent, and thus the metal foil with resin 31 or the resin film 41 before curing (A stage) or in the semi-cured state (B stage) is obtained.

The metal foil with resin 31 or the resin film 41 may further include a cover film and so on as needed. By the cover film, contamination and so on can be prevented. Although the cover film is not particularly limited as long as it can be peeled off without impairment of the form of the resin composition, and for example, a polyolefin film, a polyester film, a TPX film, films formed by providing these films with a release agent layer, and paper sheets prepared by laminating these films on a paper base material can be used.

Figure 2:
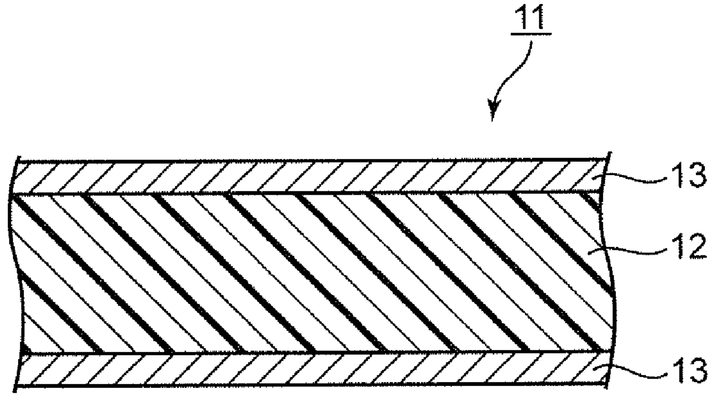
FIG. 2 is a schematic section view showing a configuration of a metal-clad laminate according to one embodiment of the present invention.

As shown in FIG. 2, the metal-clad laminate 11 of the present embodiment has the insulating layer 12 containing a cured product of the aforementioned resin composition or a cured product of the aforementioned prepreg, and the metal foil 13. As the metal foil 13 for use in the metal-clad laminate 11, the one that is the same as the metal foil 13 described above can be used.

The metal-clad laminate 11 of the present embodiment can also be prepared by using the metal foil with resin 31 or the resin film 41 as described above.

As a method for producing a metal-clad laminate using the prepreg 1, the metal foil with resin 31, or the resin film 41 obtained in the manner as described above, one or a plurality of the prepreg 1, the metal foil with resin 31 or the resin film 41 are stacked, and the metal foil 13 such as a copper foil is stacked on either or both of the upper and lower surfaces, and the stack is heating and pressurizing molded to give an integrated laminate, and thus a double face metal foil-clad laminate or a single face metal foil-clad laminate can be prepared. Although the heating and pressurizing conditions can be appropriately set depending on the thickness of the laminate to be produced, the kind of the resin composition and so on, for example, the temperature can be 170 to 220° C., the pressure can be 1.5 to 5.0 MPa, and the time can be 60 to 150 minutes.

The metal-clad laminate 11 may also be prepared by forming the film-like resin composition on the metal foil 13, and performing heating and pressurizing without using the prepreg 1.

Figure 3:
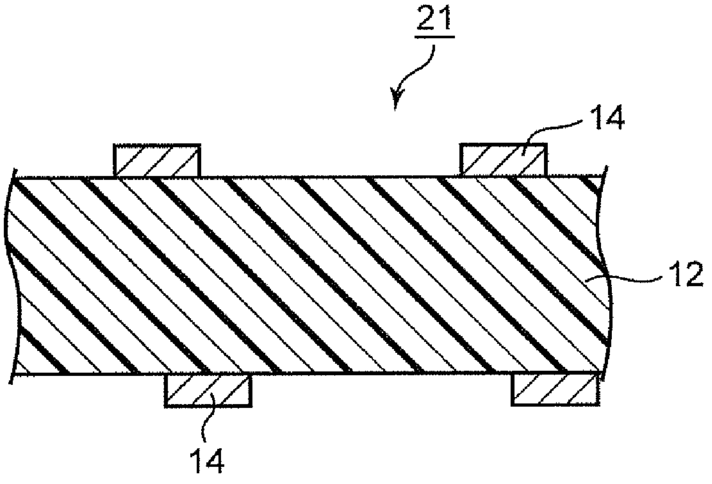
FIG. 3 is a schematic section view showing a configuration of a wiring board according to one embodiment of the present invention.

As shown in FIG. 3, the wiring board 21 of the present embodiment has the insulating layer 12 containing a cured product of the aforementioned resin composition or a cured product of the aforementioned prepreg, and the wiring 14.

It is preferred that the resin composition of the present embodiment is used as a material for an interlayer insulating layer of a wiring board. Although not particularly limited, it is preferred that the resin composition is used as a material for an interlayer insulating layer of a multilayer wiring board having 10 or more circuit layers, and further 15 or more circuit layers.

As the material for the interlayer insulating layer, it is preferred to use a plurality of insulating layers formed of the resin composition of the present embodiment. Although not particularly limited, for example, it is preferred to use 10 or more layers. This makes it possible to further densify the conductor circuit pattern in the multilayer wiring board, and would further improve the low dielectric characteristics in the plurality of interlayer insulating layers, insulation reliability between conductor circuit patterns, and insulation between interlayer circuits. Furthermore, the effect of increasing the transmission speed of signals in the multilayer wiring board, and reducing the loss during signal transmission is also obtained.

As a method for producing the wiring board 21, for example, by forming a circuit (wiring) by etching the metal foil 13 of the surface of the metal-clad laminate 13 obtained in the above, it is possible to obtain the wiring board 21 having a conductor pattern (wiring 14) provided as a circuit on the surface of the laminate. As a method for forming a circuit, circuit formation according to a semi additive process (SAP) or a modified semi additive process (MSAP) can be recited besides the method as described above.

Since the prepreg, the film with resin, and the metal foil with resin obtained by using the resin composition of the present embodiment combine excellent moldability and handleability, and low dielectric characteristics, low coefficient of thermal expansion, high Tg and adhesiveness and low water absorption in the cured products thereof, they are very useful in industrial applications.

Also, the metal-clad laminate and the wiring board produced by curing these have high heat resistance, high Tg, low coefficient of thermal expansion, high adhesiveness, low water absorption, and excellent appearance.

In the following, the present invention is described more specifically by examples, however, it is to be noted that the scope of the present invention is not limited to these examples.

EXAMPLES

In the present example, components used in preparing a resin composition are described.

Modified Polyphenylene Ether Compound

OPE-2St 1200: Terminally vinylbenzyl-modified PPE (Mw: 1600, Mn 1200, available from MITSUBISHI GAS CHEMICAL COMPANY, INC.)

OPE-2St 2200: Terminally vinylbenzyl-modified PPE (Mw: 3600, Mn 2200, available from MITSUBISHI GAS CHEMICAL COMPANY, INC.)

Modified PPE-1: Bifunctional vinylbenzyl-modified PPE (Mw: 1900)

First, a modified polyphenylene ether (modified PPE-1) was synthesized. An average number of phenolic hydroxyl groups at the molecular terminal per one molecule of polyphenylene ether is indicated by a number of terminal hydroxyl groups.

Polyphenylene ether and chloromethylstyrene were reacted to give modified polyphenylene ether 1 (modified PPE-1). Specifically, first, a 1-L three-necked flask equipped with a temperature controller, a stirrer, a cooler, and a dropping funnel was charged with 200 g of polyphenylene ether (SA90 available from SABIC Innovative Plastics, intrinsic viscosity (IV) 0.083 dl/g, number of terminal hydroxyl groups: 1.9, weight molecular weight Mw: 1700), 30 g of a mixture of p-chloromethylstyrene and m-chloromethylstyrene in a mass ratio of 50:50 (chloromethylstyrene available from TOKYO CHEMICAL INDUSTRY CO., LTD.: CMS), 1.227 g of tetra-n-butylammonium bromide as a phase transfer catalyst, and 400 g of toluene, and stirred. Then, the mixture was stirred until polyphenylene ether, chloromethylstyrene, and tetra-n-butylammonium bromide were dissolved in toluene. At this time, the mixture was gradually heated and heated until the liquid temperature finally reached 75° C. Then, to the resultant solution, a sodium hydroxide aqueous solution (sodium hydroxide 20 g/water 20 g) as an alkali metal hydroxide was dropped over 20 minutes. Thereafter, the solution was further stirred at 75° C. for 4 hours. Then, after neutralizing the contents of the flask with 10% by mass of hydrochloric acid, a large amount of methanol was introduced. This made the liquid in the flask generate a precipitate. That is, the product contained in the reaction solution in the flask was reprecipitated. Then, the precipitate was taken out by filtration, and washed three times with a mixture of methanol and water in a mass ratio of 80:20, and dried at 80° C. for 3 hours under reduced pressure.

The obtained solid was analyzed by $^1$H-NMR (400 MHz, CDCl3, TMS). In the measurement result of NMR, a peak originating from ethenylbenzyl was observed at 5 to 7 ppm. This demonstrated that the obtained solid was polyphenylene ether of which terminal was ethenylbenzylated.

The molecular weight distribution of the modified polyphenylene ether was determined by using GPC. From the obtained molecular weight distribution, a weight average molecular weight (Mw) was calculated. Mw was 1900.

Also, the number of terminal functional groups of the modified polyphenylene ether was determined in the following manner.

First, the modified polyphenylene ether was accurately weighed. The weight at this time is X (mg). Then, the weighed modified polyphenylene ether was dissolved in 25 mL of methylene chloride, and to the resultant solution, 100 μL of a 10% by mass solution of tetraethylammonium hydroxide (TEAH) in ethanol (TEAH:ethanol (volume ratio)=15:85) was added, and absorbance (Abs) at 318 nm was measured by using an UV spectrophotometer (UV-1600 available from Shimadzu Corporation). Then from the measurement result, the number of terminal hydroxyl groups of the modified polyphenylene ether was calculated using the following formula.

$$\text{Residual OH quantity } (\langle\mu\text{mol/g}\rangle) = [(25\times\text{Abs})/(\varepsilon\times OPL\times X)]\times 106$$

Here, ε represents an extinction coefficient, and is 4700 L/mol·cm. OPL represents a cell optical path length, and is 1 cm.

The calculated residual OH quantity (the number of terminal hydroxyl groups) of the modified polyphenylene ether was almost zero, revealing that almost all the hydroxyl groups of the polyphenylene ether before modification were modified. This revealed that the decrement from the number of terminal hydroxyl groups of the polyphenylene ether before modification was the number of terminal hydroxyl groups of the polyphenylene ether before modification. In other words, it was revealed that the number of terminal hydroxyl groups of the polyphenylene ether before modification was the number of terminal functional groups of the modified polyphenylene ether. That is, the number of terminal functional groups was 1.8. This is called "modified PPE-1".

SA-9000: Bifunctional methacrylate-modified PPE (Mw: 2000, available from SABIC)

SA90: Unmodified PPE, (Mw: 1700, available from SABIC Innovative Plastics)

Maleimide Compound

MIR-3000: Maleimide compound represented by formula (9) (functional group equivalent of maleimide group 275 g/eq., available from Nippon Kayaku Co., Ltd.)

BMI-4000: Maleimide compound represented by formula (10) (functional group equivalent of maleimide group 285 g/eq., available from Daiwakasei Industry Co., Ltd.)

BMI-5100: Maleimide compound represented by formula (14) (functional group equivalent of maleimide group 222 g/eq., available from Daiwakasei Industry Co., Ltd.)

BMI-2300: Maleimide compound represented by formula (8) (functional group equivalent of maleimide group 180 g/eq., available from Daiwakasei Industry Co., Ltd.)

BMI-TMH: Maleimide compound represented by formula (11) (functional group equivalent of maleimide group 159 g/eq., available from Daiwakasei Industry Co., Ltd.)

Styrene-Butadiene Copolymer

Ricon 181: Styrene-butadiene copolymer (available from CRAY VALLEY, styrene: 28% by mass, butadiene: 72% by mass; 1,2-vinyl in butadiene: 30%; Mw about 5400)

Ricon 100: Styrene-butadiene copolymer (available from CRAY VALLEY, styrene: 25% by mass, butadiene: 75% by mass; 1,2-vinyl in butadiene: 70%; Mw about 6500)

Ricon 184: Styrene-butadiene copolymer (available from CRAY VALLEY, styrene: 28% by mass, butadiene: 72% by mass; 1,2-vinyl in butadiene: 30%; Mw about 9800)

Septon V9827: Hydrogenated SBS (styrene-butadiene-styrene) copolymer (Mw: 94000, available from KURARAY CO., LTD.)

SX-100: Styrene-based polymer (Mw 2500, available from YASUHARA CHEMICAL CO., LTD.)

The weight average molecular weight of each of Ricon 181, Ricon 100, and Ricon 184 was determined by GPC (apparatus: HLC-8120GPC available from TOSOH CORPORATION, column: double Super HM-H available from TOSOH CORPORATION, eluent: chloroform, standard sample: monodisperse polybutadiene available from S.A.S.).

Other Components

Reaction Initiator

PERBUTYL P: 1,3-bis(butylperoxyisopropyl)benzene (available from NOF CORPORATION)

Inorganic Filler

SC2500-SXJ: Phenylaminosilane surface treated spherical silica (available from Admatechs Company Limited)

Examples 1 to 23, Comparative Examples 1 to 7

Preparation Method

Resin Varnish

First, a modified PPE (or unmodified PPE), a maleimide compound, and a styrene-butadiene copolymer (or styrene-based polymer) were added to methylethylketone (MEK) in a blending ratio described in Tables 1 to 3 so that the solid concentration was 40% by mass, and they were mixed and dissolved by stirring under heating at 70 degrees for 60 minutes. The mixture was allowed to cool to 25 degrees, and then a peroxide, an inorganic filler and so on were added, and stirred and dispersed by a beads mill, to obtain resin varnish (MEK solution resin varnish). As to Comparative Examples 4 to 5, however, the inventors tried to prepare resin varnish by mixing the organic components with methylethylketone, but could not prepare MEK solution resin varnish because the styrene-based polymer failed to dissolve.

As to Comparative Example 5, resin varnish was prepared in the following method. The modified PPE and the maleimide compound in the ratio described in Table 2 were added to MEK so that the solid concentration was 40% by mass, and they were mixed and dissolved by stirring under heating at 70 degrees for 60 minutes. To the mixture, a predetermined amount of a toluene solution of the styrene-based polymer prepared to have a solid content of 20% by mass was added, and the mixture was allowed to cool to 25 degrees under mixing and stirring, and then a peroxide, an inorganic filler and so on were added, and stirred and dispersed by a beads mill, to obtain resin varnish (MEK-toluene mixed solution resin varnish).

As to Comparative Example 4, resin vanish could not be prepared even with this method. Therefore, the following evaluation tests could not be conducted for the resin composition of Comparative Example 4.

Prepreg

Preparation of Prepreg-1

After impregnating glass cloth (available from NITTO BOSEKI CO., LTD., #2116 type, E glass) with resin varnish of each of Examples and Comparative Examples prepared above, it was heat dried at 140° C. for about 4 minutes to give a prepreg. At that time, the content of the resin composition (resin content) relative to the weight of the prepreg was adjusted to about 46% by mass.

Preparation of Prepreg-II

After impregnating glass cloth (available from NITTO BOSEKI CO., LTD., #1067 type, NE glass) with resin varnish of each of Examples and Comparative Examples, it was heat dried at 140° C. for about 4 minutes to give a prepreg. At that time, the content of the resin composition (resin content) relative to the weight of the prepreg was adjusted to about 73% by mass.

Copper-Clad Laminate

On both sides of one sheet of the prepreg-I, a copper foil having a thickness of 12 μm (GT-MP, available from FURUKAWA ELECTRIC CO., LTD.) was disposed to give an object to be compressed, and the object was heated and pressurized at a temperature of 220° C., with a pressure of 40 kgf/$cm^2$ in a vacuum condition for 90 minutes to give a copper-clad laminate-I having a thickness of about 0.1 mm to which copper foils are adhered on both sides. Also, eight sheets of the prepreg were stacked, and a copper-clad laminate-II having a thickness of about 0.8 mm was obtained in the same manner as described above.

Also, twelve sheets of the prepreg-II were stacked, and a copper-clad laminate-III having a thickness of about 0.8 mm was obtained in the same manner as described above.

Evaluation Tests

Storage Stability of Resin Varnish

The MEK solution resin varnish (Examples 1 to 23 and Comparative Examples 1 to 3, 6 to 7), and MEK-toluene mixed solution resin varnish (Comparative Example 5) prepared above were left to stand at 25 degrees for 24 hours, and when no change was observed in the varnish appearance, the varnish was evaluated as "good", and when change in appearance such as precipitation of resin or separation of resin was observed, the varnish was evaluated as "poor".

Glass Transition Temperature (Tg)

The whole surface of the outer layer copper foil of the copper-clad laminate I was etched, and for the obtained sample, Tg was measured by using a viscoelasticity spectrometer "DMS100" available from Seiko Instruments Inc. At this time, dynamic viscoelasticity measurement (DMA) was performed by a tensile module at a frequency of 10 Hz, and the temperature at which tan δ showed the maximum when the temperature was elevated to 300° C. from the room temperature at a temperature elevation rate of 5° C./min was determined as Tg.

Coefficient of Thermal Expansion (CTE)

The copper foil was removed from the copper-clad laminate-I to obtain a test piece, and for the test piece, a coefficient of thermal expansion in the plane direction of the base material (tensile direction, Y direction) at a temperature less than the glass transition temperature of the resin cured product was measured by Thermo-mechanical analysis (TMA) method. Specifically, the measurement was performed in a tensile mode using a TMA apparatus ("TMA6000" available from SII Nano Technology). In order to eliminate the influence of the heat strain possessed by the test piece, the cycle of temperature rise and cooling was repeated twice, and an average coefficient of thermal expansion at 40° C. to 100° C. in the temperature displacement chart of the second cycle was determined. The smaller value means the better result. The unit is ppm/° C.

Measuring Conditions

1st cycle: temperature rising range 30° C.→Tg+10° C.
2nd cycle: temperature rising range 30° C.→300° C.
Temperature rising range: 10° C./min, load: 1 g
Test piece: 3.5 mm (width), 20 mm (tensile direction)

Copper Foil Adhesivity

In the copper-clad laminate I, copper foil peel strength of copper foil from the insulating layer was measured in accordance with JIS C 6481. A pattern having a width of 10 mm and a length of 100 mm was formed, and tearing was performed at a rate of 50 mm/min with a tensile tester, and a tearing strength (peel strength) at this time was measured, and the obtained copper foil peel strength was determined as a copper foil adhesion strength. The measurement unit was kN/m.

(Dielectric Characteristics: Dielectric Constant (Dk) and Dielectric Loss Tangent (Df))

Using a laminate obtained by removing the copper foil from the copper-clad laminate-III as a test piece, the test piece was dried in an oven at 105 degrees for 2 hours to remove the moisture in the test piece. The test piece taken out of the oven was placed in a desiccator and allowed to cool to 25 degrees, and dielectric constant (Dk) and dielectric loss tangent (Df) of the test piece were measured by a cavity resonator perturbation method. Specifically, using a network analyzer (N5230A available from Agilent Technologies, Inc.), dielectric constant (Dk) and dielectric loss tangent (Df-I) of the test piece at 10 GHz were measured.

Dielectric Characteristics: Df Variation after Water Absorption (ΔDf)

After dipping the test piece for dielectric loss tangent in water at 23° C. for 24 hours, the test piece from which the water on the surface was wiped off was measured for dielectric loss tangent (Df-II) of the evaluation substrate at 10 GHz in the same method as described above. ΔDf was determined according to the following calculation formula, and evaluation was made in the following criteria.

$$\Delta Df = (Df - II) - (Df - I)$$

Excellent: Variation is less than 0.0025
Good: Variation is 0.0025 or more and less than 0.0030

Fair: Variation is 0.0030 or more and less than 0.0035
Poor: Variation is 0.0035 or more Water Absorption Using a laminate obtained by removing the copper foil from the copper-clad laminate-III as an evaluation substrate, water absorption was evaluated according to IPC-TM-650 2.6.2.1. Water absorption conditions include a pretreatment at 105° C. for 24 hours and a treatment in constant-temperature water at 23° C. for 24 hours. Water absorption was calculated according to the following formula:

$$\text{Water absorption (\%)} = ((\text{mass after water absorption} - \text{mass before water absorption})/\text{weight before absorption}) \times 100$$

Resin Fluidity

Resin fluidity was evaluated using the prepreg-II. Resin fluidity of the prepreg-II obtained by using resin varnish of Examples 1 to 9 was determined in accordance with IPC-TM-650 2.3.17D. The prepreg was hot plate pressed for 15 minutes under the molding conditions of a temperature of 171° C. and a pressure of 14 kgf/cm$^2$. As to the number of prepregs for use in measurement, four prepregs-II prepared in the manner as described above were used.

Circuit Fillability, Grid Pattern (Percentage of Remaining Copper) 50%

On both sides of one sheet of the prepreg-I, a copper foil having a thickness of 35 μm (GTHMP35, available from FURUKAWA ELECTRIC CO., LTD.) was disposed to give an object to be compressed, and the object was heated and pressurized at a temperature of 220° C., with a pressure of 40 kg/cm$^2$ for 90 minutes to give a copper-clad laminate having a thickness of 0.1 mm to which copper foils are adhered on both sides.

Then, for each of the copper foils on both sides of the copper-clad laminate, a grid-like pattern was formed so that the percentage of remaining copper was 50% to form a circuit. On each side of the substrate on which the circuit was formed, one sheet of prepreg-II was laminated, and a copper foil having a thickness of 12 μm ("GTHMP12" available from Furukawa Electric Co., Ltd.) was arranged to give an object to be compressed, and heating and pressurizing was conducted in the same conditions as those in production of the copper-clad laminate. Then, the outer layer copper foils were etched over the entire surface to obtain a sample. In the formed laminate (laminate for evaluation), if the resin composition derived from the prepreg sufficiently enter between the circuits, and voids were not formed, the sample was evaluated as "good". If the resin composition derived from the prepreg failed to sufficiently enter between the circuits, and voids were formed, the sample was evaluated as "poor". Voids can be visually confirmed.

Handleability and Dust Fall Test

In handling a prepreg, for example, in producing or cutting a prepreg, dust of a resin composition or a semi-cured product thereof can fall. In other words, dust fall can occur. In the evaluation test, the prepreg-II was cut with a cutter knife, and when occurrence of such dust fall was not observed, the prepreg-II was evaluated as "good", and when occurrence of such dust fall was observed, the prepreg-II was evaluated as "poor".

Appearance after Copper Foil Etching of CCL

A laminate from which the copper foil of the copper clad laminate-I was removed by etching was visually observed, and evaluation was made by checking voids and blurs.

Criteria for evaluation:

Good: No void or blur is observed.

Poor: Void or blur, bleeding of resin is observed on surface of laminate of 300×300 mm.

Warpage Amount of Package (μm)

First, a flip chip (FC) was mounted on the substrate by adhering with a stiffener ("HCV5313HS" available from Panasonic Corporation) to produce a simple FC-mounted PKG (size: 16 mm×16 mm) for measuring PKG warpage amount. Here, as the FC, a Si chip having a size of 15.06 mm×15.06 mm×0.1 mm on which 4356 solder balls (height: 80 μm) were mounted was used. As the substrate, the copper-clad laminate-I from which the copper foil was removed was used.

Next, the FC-mounted PKG was measured for warpage according to the shadow moire measurement theory using a warpage measuring device ("THERMOIRE PS200" available from AKROMETRIX). The PKG warpage amount was determined as difference between the maximum value and the minimum value of the warpage amounts when the FC-mounted PKG was heated from 25° C. to 260° C., and then cooled to 25° C.

These results are shown in Tables 1 to 3.

TABLE 1

| | | | | Example 1 | Example 2 | Example 3 | Example 4 | Example 5 | Example 6 |
|---|---|---|---|---|---|---|---|---|---|
| PPE | Modified PPE | OPE-2St 1200 | Terminal vinylbenzyl-modified PPE | 57 | 54 | 51 | 48 | 42 | 30 |
| | | OPE-2St 2200 | Terminal vinylbenzyl-modified PPE | | | | | | |
| | | Modified PPE-1 | Terminal vinylbenzyl-modified PPE | | | | | | |
| | | SA9000 | Terminal methacrylate-modified PPE | | | | | | |
| | Unmodified PPE | SA90 | Unmodified PPE | | | | | | |

TABLE 1-continued

| | | | | | | | | | |
|---|---|---|---|---|---|---|---|---|---|
| Bismaleimide | | BMI-4000 | | 38 | 36 | 34 | 32 | 28 | 20 |
| | | MIR-3000 | | | | | | | |
| | | BMI-5100 | | | | | | | |
| | | BMI-2300 | | | | | | | |
| | | BMI-TMH | | | | | | | |
| SB copolymer | | Ricon181 | Styrene/butadiene copolymer | 5 | 10 | 15 | 20 | 30 | 50 |
| | | Ricon100 | Styrene/butadiene copolymer | | | | | | |
| | | Ricon184 | Styrene/butadiene copolymer | | | | | | |
| Styrene-based polymer | | Septon V9827 | Styrene/hydrogenated polybutadiene polymer | | | | | | |
| | | SX100 | Styrene elastomer | | | | | | |
| Peroxide | | PERBUTYL P | | | | | | | |
| Inorganic filler | | SC2050-MTX | | 120 | 120 | 120 | 120 | 120 | 120 |
| Evaluation tests | | Tg (°C) | | 265 | 265 | 260 | 260 | 255 | 245 |
| | | CTE (ppm/°C) | | 12 | 11 | 10 | 8 | 8 | 7 |
| | | Warpage amount of package (μm) | | 460 | 430 | 350 | 330 | 325 | 300 |
| | | Copper foil adhesivity (kN/m) | | 0.70 | 0.60 | 0.60 | 0.60 | 0.50 | 0.45 |
| | | Dk @10 GHz | | 3.2 | 3.2 | 3.2 | 3.1 | 3.1 | 3.0 |
| | | Df @10 GHz | | 0.0025 | 0.0023 | 0.0022 | 0.0022 | 0.0020 | 0.0018 |
| | | ΔDf | | Good | Excellent | Excellent | Excellent | Excellent | Excellent |
| | | Water absorption (%) | | 0.28 | 0.25 | 0.20 | 0.15 | 0.13 | 0.10 |
| | | Resin fluidity (%) | | 20 | 25 | 25 | 25 | 30 | 35 |
| | | Circuit fillability | | Good | Good | Good | Good | Good | Good |
| | | MEK solution resin varnish | | Preparable | Preparable | Preparable | Preparable | Preparable | Preparable |
| | | Toluene-MEK mixed solution resin varnish | | Preparable | Preparable | Preparable | Preparable | Preparable | Preparable |
| | | Storage stability of resin varnish | | Good | Good | Good | Good | Good | Good |
| | | Handleability | | Good | Good | Good | Good | Good | Good |
| | | Appearance after copper foil etching of CCL | | Good | Good | Good | Good | Good | Good |
| | | | | Example 7 | Example 8 | Example 9 | Example 10 | Example 11 | Example 12 |
| PPE | Modified PPE | OPE-2St 1200 | Terminal vinylbenzyl-modified PPE | 80.75 | 76.5 | 68.0 | 59.5 | 42.5 | 34.0 |
| | | OPE-2St 2200 | Terminal vinylbenzyl-modified PPE | | | | | | |
| | | Modified PPE-1 | Terminal vinylbenzyl-modified PPE | | | | | | |
| | | SA9000 | Terminal methacrylate-modified PPE | | | | | | |
| | Unmodified PPE | SA90 | Unmodified PPE | | | | | | |
| Bismaleimide | | BMI-4000 | | 4.25 | 8.5 | 17.0 | 25.5 | 42.5 | 51.0 |
| | | MIR-3000 | | | | | | | |
| | | BMI-5100 | | | | | | | |
| | | BMI-2300 | | | | | | | |
| | | BMI-TMH | | | | | | | |
| SB copolymer | | Ricon181 | Styrene/butadiene copolymer | 15 | 15 | 15 | 15 | 15 | 15 |
| | | Ricon100 | Styrene/butadiene copolymer | | | | | | |
| | | Ricon184 | Styrene/butadiene copolymer | | | | | | |
| Styrene-based polymer | | Septon V9827 | Styrene/hydrogenated polybutadiene polymer | | | | | | |
| | | SX100 | Styrene elastomer | | | | | | |
| Peroxide | | PERBUTYL P | | | | | | | |
| Inorganic filler | | SC2050-MTX | | 120 | 120 | 120 | 120 | 120 | 120 |
| Evaluation tests | | Tg (°C) | | 240 | 245 | 260 | 260 | 265 | 270 |
| | | CTE (ppm/°C) | | 12 | 12 | 11 | 10 | 10 | 10 |
| | | Warpage amount of package (μm) | | 455 | 450 | 420 | 380 | 370 | 370 |
| | | Copper foil adhesivity (kN/m) | | 0.65 | 0.65 | 0.65 | 0.60 | 0.60 | 0.55 |
| | | Dk @10 GHz | | 3.1 | 3.1 | 3.1 | 3.2 | 3.2 | 3.3 |
| | | Df @10 GHz | | 0.0020 | 0.0020 | 0.0022 | 0.0022 | 0.0024 | 0.0026 |
| | | ΔDf | | Excellent | Excellent | Excellent | Excellent | Good | Fair |
| | | Water absorption (%) | | 0.10 | 0.13 | 0.15 | 0.18 | 0.28 | 0.30 |
| | | Resin fluidity (%) | | 30 | 30 | 30 | 25 | 20 | 20 |

TABLE 1-continued

| | | | | | | | |
|---|---|---|---|---|---|---|---|
| | Circuit fillability | Good | Good | Good | Good | Good | Good |
| | MEK solution resin varnish | Preparable | Preparable | Preparable | Preparable | Preparable | Preparable |
| | Toluene-MEK mixed solution resin varnish | Preparable | Preparable | Preparable | Preparable | Preparable | Preparable |
| | Storage stability of resin varnish | Good | Good | Good | Good | Good | Good |
| | Handleability | Good | Good | Good | Good | Good | Good |
| | Appearance after copper foil etching of CCL | Good | Good | Good | Good | Good | Good |

TABLE 2

| | | | | Example 13 | Example 14 | Example 15 | Example 16 | Example 17 | Example 18 |
|---|---|---|---|---|---|---|---|---|---|
| PPE | Modified PPE | OPE-2St 1200 | Terminal vinylbenzyl-modified PPE | 51 | 51 | 51 | 51 | 51 | 51 |
| | | OPE-2St 2200 | Terminal vinylbenzyl-modified PPE | | | | | | |
| | | Modified PPE-1 | Terminal vinylbenzyl-modified PPE | | | | | | |
| | | SA9000 | Terminal methacrylate-modified PPE | | | | | | |
| | Unmodified PPE | SA90 | Unmodified PPE | | | | | | |
| Bismaleimide | | BMI-4000 | | | | | | 34 | 34 |
| | | MIR-3000 | | 34 | | | | | |
| | | BMI-5100 | | | 34 | | | | |
| | | BMI-2300 | | | | 34 | | | |
| | | BMI-TMH | | | | | 34 | | |
| SB copolymer | | Ricon181 | Styrene/butadiene copolymer | 15 | 15 | 15 | 15 | | |
| | | Ricon100 | Styrene/butadiene copolymer | | | | | 15 | |
| | | Ricon184 | Styrene/butadiene copolymer | | | | | | 15 |
| Styrene-based polymer | | Septon V9827 | Styrene/hydrogenated polybutadiene polymer | | | | | | |
| | | SX100 | Styrene elastomer | | | | | | |
| Peroxide | | PERBUTYL P | | | | | | | |
| Inorganic filler | | SC2050-MTX | | 120 | 120 | 120 | 120 | 120 | 120 |
| Evaluation tests | | Tg (°C) | | 260 | 260 | 265 | 260 | 260 | 260 |
| | | CTE (ppm/°C) | | 10 | 10 | 10 | 10 | 10 | 10 |
| | | Warpage amount of package (μm) | | 350 | 350 | 350 | 350 | 365 | 370 |
| | | Copper foil adhesivity (kN/m) | | 0.60 | 0.60 | 0.60 | 0.60 | 0.60 | 0.60 |
| | | Dk @10 GHz | | 3.2 | 3.1 | 3.2 | 3.1 | 3.2 | 3.2 |
| | | Df @10 GHz | | 0.0022 | 0.0023 | 0.0023 | 0.0022 | 0.0022 | 0.0022 |
| | | ΔDf | | Excellent | Excellent | Good | Good | Excellent | Excellent |
| | | Water absorption (%) | | 0.20 | 0.25 | 0.28 | 0.28 | 0.20 | 0.20 |
| | | Resin fluidity (%) | | 25 | 25 | 25 | 25 | 15 | 10 |
| | | Circuit fillability | | Good | Good | Good | Good | Good | Good |
| | | MEK solution resin varnish | | Preparable | Preparable | Preparable | Preparable | Preparable | Preparable |
| | | Toluene-MEK mixed solution resin varnish | | Preparable | Preparable | Preparable | Preparable | Preparable | Preparable |
| | | Storage stability of resin varnish | | Good | Good | Good | Good | Good | Good |
| | | Handleability | | Good | Good | Good | Good | Good | Good |
| | | Appearance after copper foil etching of CCL | | Good | Good | Good | Good | Good | Good |

| | | | | Example 19 | Example 20 | Example 21 | Example 22 | Example 23 |
|---|---|---|---|---|---|---|---|---|
| PPE | Modified PPE | OPE-2St 1200 | Terminal vinylbenzyl-modified PPE | | 51 | | | |
| | | OPE-2St 2200 | Terminal vinylbenzyl-modified PPE | 51 | | 51 | | |
| | | Modified PPE-1 | Terminal vinylbenzyl-modified PPE | | | | 51 | |
| | | SA9000 | Terminal methacrylate-modified PPE | | | | | 51 |

TABLE 2-continued

| | | | | | | | | |
|---|---|---|---|---|---|---|---|---|
| | Unmodified PPE | SA90 | Unmodified PPE | | | | | |
| Bismaleimide | | BMI-4000 | | 34 | 34 | 34 | 34 | 34 |
| | | MIR-3000 | | | | | | |
| | | BMI-5100 | | | | | | |
| | | BMI-2300 | | | | | | |
| | | BMI-TMH | | | | | | |
| SB copolymer | | Ricon181 | Styrene/butadiene copolymer | 15 | 15 | 15 | 15 | 15 |
| | | Ricon100 | Styrene/butadiene copolymer | | | | | |
| | | Ricon184 | Styrene/butadiene copolymer | | | | | |
| Styrene-based polymer | | Septon V9827 | Styrene/hydrogenated polybutadiene polymer | | | | | |
| | | SX100 | Styrene elastomer | | | | | |
| Peroxide | | PERBUTYL P | | | 1 | 1 | 1 | 1 |
| Inorganic filler | | SC2050-MTX | | 120 | 120 | 120 | 120 | 120 |
| Evaluation tests | | Tg (°C) | | 250 | 270 | 260 | 260 | 265 |
| | | CTE (ppm/°C) | | 10 | 10 | 10 | 10 | 10 |
| | | Warpage amount of package (μm) | | 350 | 350 | 350 | 350 | 350 |
| | | Copper foil adhesivity (kN/m) | | 0.60 | 0.60 | 0.60 | 0.60 | 0.60 |
| | | Dk @10 GHz | | 3.2 | 3.3 | 3.3 | 3.3 | 3.3 |
| | | Df @10 GHz | | 0.0022 | 0.0028 | 0.0028 | 0.0028 | 0.0029 |
| | | ΔDf | | Excellent | Excellent | Excellent | Excellent | Excellent |
| | | Water absorption (%) | | 0.20 | 0.25 | 0.25 | 0.25 | 0.25 |
| | | Resin fluidity (%) | | 20 | 25 | 20 | 20 | 20 |
| | | Circuit fillability | | Good | Good | Good | Good | Good |
| | | MEK solution resin varnish | | Preparable | Preparable | Preparable | Preparable | Preparable |
| | | Toluene-MEK mixed solution resin varnish | | Preparable | Preparable | Preparable | Preparable | Preparable |
| | | Storage stability of resin varnish | | Good | Good | Good | Good | Good |
| | | Handleability | | Good | Good | Good | Good | Good |
| | | Appearance after copper foil etching of CCL | | Good | Good | Good | Good | Good |

TABLE 3

| | | | | Comparative Example 1 | Comparative Example 2 | Comparative Example 3 | Comparative Example 4 |
|---|---|---|---|---|---|---|---|
| PPE | Modified PPE | OPE-2St 1200 | Terminal vinylbenzyl-modified PPE | 60 | 60 | 77 | 51 |
| | | OPE-2St 2200 | Terminal vinylbenzyl-modified PPE | | | | |
| | | Modified PPE-1 | Terminal vinylbenzyl-modified PPE | | | | |
| | | SA9000 | Terminal methacrylate-modified PPE | | | | |
| | Unmodified PPE | SA90 | Unmodified PPE | | | | |
| Bismaleimide | | BMI-4000 | | 40 | 40 | | 34 |
| | | MIR-3000 | | | | | |
| | | BMI-5100 | | | | | |
| | | BMI-2300 | | | | | |
| | | BMI-TMH | | | | | |
| SB copolymer | | Ricon181 | Styrene/butadiene copolymer | | | 23 | |
| | | Ricon100 | Styrene/butadiene copolymer | | | | |
| | | Ricon184 | Styrene/butadiene copolymer | | | | |
| Styrene-based polymer | | Septon V9827 | Styrene/hydrogenated polybutadiene polymer | | | | 15 |
| | | SX100 | Styrene elastomer | | | | |
| Peroxide | | PERBUTYL P | | | 1 | | |
| Inorganic filler | | SC2050-MTX | | 120 | 120 | 120 | 120 |
| Evaluation tests | | Tg (°C) | | 265 | 275 | 195 | |
| | | CTE (ppm/°C) | | 14 | 14 | 13 | |
| | | Warpage amount of package (μm) | | 535 | 528 | 500 | |

TABLE 3-continued

| | | | | |
|---|---|---|---|---|
| Copper foil adhesivity (kN/m) | 0.75 | 0.75 | 0.40 | |
| Dk @10 GHz | 3.3 | 3.3 | 3.0 | |
| Df @10 GHz | 0.0030 | 0.0035 | 0.0020 | |
| ΔDf | Poor | Poor | Excellent | |
| Water absorption (%) | 0.32 | 0.35 | 0.10 | |
| Resin fluidity (%) | 20 | 20 | 25 | |
| Circuit fillability | Good | Good | Good | |
| MEK solution resin varnish | Preparable | Preparable | Preparable | Unpreparable |
| Toluene-MEK mixed solution resin varnish | Preparable | Preparable | Preparable | Unpreparable |
| Storage stability of resin varnish | Good | Good | Good | |
| Handleability | Poor | Poor | Good | |
| Appearance after copper foil etching of CCL | Good | Good | Good | |

| | | | | Comparative Example 5 | Comparative Example 6 | Comparative Example 7 |
|---|---|---|---|---|---|---|
| PPE | Modified PPE | OPE-2St 1200 | Terminal vinylbenzyl-modified PPE | 51 | 51 | |
| | | OPE-2St 2200 | Terminal vinylbenzyl-modified PPE | | | |
| | | Modified PPE-1 | Terminal vinylbenzyl-modified PPE | | | |
| | | SA9000 | Terminal methacrylate-modified PPE | | | |
| | Unmodified PPE | SA90 | Unmodified PPE | | | 51 |
| Bismaleimide | | BMI-4000 | | | 34 | 34 |
| | | MIR-3000 | | | | |
| | | BMI-5100 | | | | |
| | | BMI-2300 | | | | |
| | | BMI-TMH | | 34 | | |
| SB copolymer | | Ricon181 | Styrene/butadiene copolymer | | | 15 |
| | | Ricon100 | Styrene/butadiene copolymer | | | |
| | | Ricon184 | Styrene/butadiene copolymer | | | |
| Styrene-based polymer | | Septon V9827 | Styrene/hydrogenated polybutadiene polymer | 15 | | |
| | | SX100 | Styrene elastomer | | 15 | |
| Peroxide | | PERBUTYL P | | | | |
| Inorganic filler | | SC2050-MTX | | 120 | 120 | 120 |
| Evaluation tests | | Tg (°C) | | 250 | 210 | 160 |
| | | CTE (ppm/°C) | | 13 | 16 | 15 |
| | | Warpage amount of package (μm) | | 502 | 611 | 581 |
| | | Copper foil adhesivity (kN/m) | | 0.35 | 0.40 | 0.25 |
| | | Dk @10 GHz | | 3.2 | 3.2 | 3.5 |
| | | Df @10 GHz | | 0.0022 | 0.0022 | 0.0045 |
| | | ΔDf | | Excellent | Excellent | Poor |
| | | Water absorption (%) | | 0.20 | 0.20 | 0.40 |
| | | Resin fluidity (%) | | 5 | 25 | 25 |
| | | Circuit fillability | | Poor | Good | Good |
| | | MEK solution resin varnish | | Unpreparable | Preparable | Preparable |
| | | Toluene-MEK mixed solution resin varnish | | Preparable | Preparable | Preparable |
| | | Storage stability of resin varnish | | Poor | Good | Good |
| | | Handleability | | Poor | Poor | Good |
| | | Appearance after copper foil etching of CCL | | Poor | Good | Good |

Discussion

As is apparent from the results shown in Table 1 to Table 3, it was revealed that the present invention can provide a resin composition having high Tg and excellent adhesiveness (Tg 240° C. or more, peel 0.45 kN/m or more) in a cured product thereof, in addition to low dielectric characteristics (Dk: 3.3 or less, Df: 0.0029 or less). Also, it was confirmed that variation in Df was controlled even after water absorption by using the resin composition of the present invention.

Also, in every Example, it was confirmed that the coefficient of thermal expansion (CTE) in the plane direction can be controlled to a low level, and warpage can be suppressed when the laminate is used as a package substrate. Also, handleability and moldability of a prepreg, and appearance after etching of CCL were excellent.

In particular, it was found that cured products that are more excellent in the above characteristics are obtained when the content of the styrene-butadiene copolymer and the content ratio of components fall within preferred ranges (Examples 1 to 12).

In contrast, in Comparative Example 1 in which a styrene-butadiene copolymer was not used, the coefficient of thermal expansion was high, and sufficient low dielectric characteristics (especially Df) and low water absorption were not obtained, and variation in Df after water absorption was large. Even when a reaction initiator was added in Comparative Example 1, the same result was obtained (Comparative Example 2).

In Comparative Example 3 in which a maleimide compound was not used, high Tg was not obtained, and CTE was large.

In Comparative Example 4 in which a styrene polymer of high-molecular weight elastomer was used in place of a styrene-butadiene copolymer, varnish could not be made as described above.

In Comparative Example 5, MEK-toluene mixed solution resin varnish could be obtained, but the resin varnish was poor in storage stability. Also, the prepared prepreg had low resin fluidity, and insufficient circuit fillability. Also, the resin failed to mingle well to cause bleeding due to the large molecular weight, and the appearance after copper foil etching of CCL impaired.

In Comparative Example 6 in which a low molecular weight styrene-based polymer was used in place of the styrene-butadiene copolymer, Tg and adhesiveness deteriorated, raising a concern in connection reliability at high temperature in the resultant wiring board. Also, the coefficient of thermal expansion of the laminate was high, and the package warpage was high.

Further, in Comparative Example 7 in which an unmodified polyphenylene ether compound was used, curing of the resin composition did not proceed well, and Tg decreased, and adhesiveness, dielectric characteristics and ΔDf were also poor.

The present application is based on Japanese Patent Application No. 2019-177944 filed on Sep. 27, 2019, and the content thereof is incorporated in the present application.

While the present invention was described appropriately and sufficiently in the above through the embodiments by referring to specific examples, drawings and so on for expressing the present invention, it is to be recognized that a person skilled in the art can easily change and/or modify the aforementioned embodiments. Therefore, it is interpreted that a changed form or a modified form made by a person skilled in the art is encompassed in the scope of a claim unless the changed form or the modified form departs from the scope of the claim disclosed in the claim.

INDUSTRIAL APPLICABILITY

The present invention has broad industrial applicability in technical fields concerning electronic materials and various devices using the same.

The invention claimed is:

1. A resin composition comprising:

a modified polyphenylene ether compound having a carbon-carbon unsaturated double bond at a molecular end;

a maleimide compound having two or more N-substituted maleimide groups in one molecule; and a liquid styrene-butadiene copolymer having a weight average molecular weight of less than 10000 and having a 1,2-vinyl group, wherein the modified polyphenylene ether compound has at least one of structures represented by formulas (1) and (2):

(1)

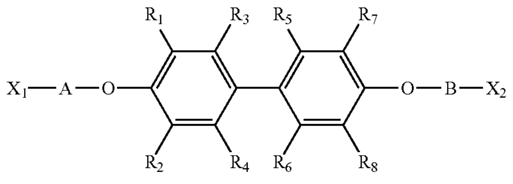

(2)

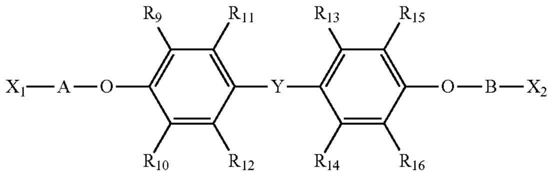

wherein $R_1$ to $R_8$ and $R_9$ to $R_{16}$ each independently represent a hydrogen atom, an alkyl group, an alkenyl group, an alkynyl group, a formyl group, an alkylcarbonyl group, an alkenylcarbonyl group, or an alkynylcarbonyl group, and A and B respectively represent structures shown by formulas (3) and (4):

(3)

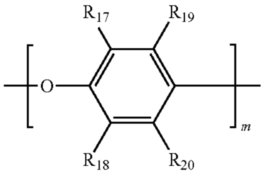

(4)

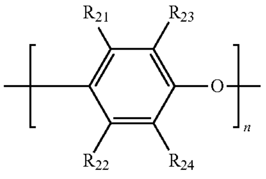

wherein m and n each represent an integer of 1 to 50, and $R_{17}$ to $R_{20}$ and $R_{21}$ to $R_{24}$ each independently represent a hydrogen atom or an alkyl group, and in formula (2), Y is a structure represented by formula (5):

(5)

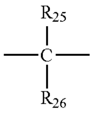

wherein $R_{25}$ and $R_{26}$ each independently represent a hydrogen atom or an alkyl group, and $X_1$ and $X_2$ each independently represent a substituent having a carbon-carbon unsaturated double bond as represented by formula (6), and $X_1$ and $X_2$ may be same or different, (6)

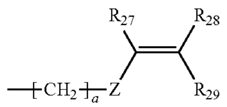

wherein a represents an integer of 0 to 10, Z represents an arylene group, and $R_{27}$ to $R_{29}$ each independently represent a hydrogen atom or an alkyl group;

a content of the maleimide compound is 5 to 40 parts by mass per 100 parts by mass of a total of the modified polyphenylene ether compound, the maleimide compound, and the styrene-butadiene copolymer;

a content of the styrene-butadiene copolymer is 5 to 30 parts by mass per 100 parts by mass of a total of the modified polyphenylene ether compound, the maleimide compound, and the styrene-butadiene copolymer;

and a content ratio between the modified polyphenylene ether compound and the maleimide compound is 90:10 to 50:50.

2. The resin composition according to claim 1, wherein the modified polyphenylene ether compound has a weight average molecular weight (Mw) of 1000 to 5000.

3. The resin composition according to claim 1, wherein the modified polyphenylene ether compound has one to five functional groups in one molecule.

4. The resin composition according to claim 1, wherein a styrene content in the styrene-butadiene copolymer is 50% by mass or less, and a butadiene content in the styrene-butadiene copolymer is 50% by mass or more.

5. The resin composition according to claim 4, wherein the styrene content in the styrene-butadiene copolymer is 20 to 50% by mass, and the butadiene content in the styrene-butadiene copolymer is 50 to 80% by mass.

6. The resin composition according to claim 1, wherein a 1,2-vinyl content in butadiene in the styrene-butadiene copolymer is 30 to 70%.

7. A prepreg comprising:

the resin composition according to claim 1, or a semi-cured product of the resin composition; and a fibrous base material.

8. A metal-clad laminate comprising:

an insulating layer containing a cured product of the prepreg according to claim 7; and a metal foil.

9. A wiring board comprising:

an insulating layer containing a cured product of the prepreg according to claim 7; and wiring.

10. A film with resin, comprising:

a resin layer containing the resin composition according to claim 1, or a semi-cured product of the resin composition; and a support film.

11. A metal foil with resin, comprising:

a resin layer containing the resin composition according to claim 1, or a semi-cured product of the resin composition; and a metal foil.

12. A metal-clad laminate comprising:

an insulating layer containing a cured product of the resin composition according to claim 1; and a metal foil.

13. A wiring board comprising:

an insulating layer containing a cured product of the resin composition according to claim 1; and wiring.

* * * * *